US006392163B1

United States Patent
Rinne et al.

(10) Patent No.: US 6,392,163 B1
(45) Date of Patent: May 21, 2002

(54) CONTROLLED-SHAPED SOLDER RESERVOIRS FOR INCREASING THE VOLUME OF SOLDER BUMPS

(75) Inventors: Glenn A. Rinne, Cary; Paul A. Magill, Chapel Hill, both of NC (US)

(73) Assignee: Unitive International Limited, Curacao (AN)

( * ) Notice: Subject to any disclaimer, the term of this patent is extended or adjusted under 35 U.S.C. 154(b) by 0 days.

(21) Appl. No.: 09/790,421

(22) Filed: Feb. 22, 2001

Related U.S. Application Data

(63) Continuation of application No. 09/122,285, filed on Jul. 24, 1998, which is a continuation-in-part of application No. 08/977,258, filed on Nov. 24, 1997, now Pat. No. 5,892,179, which is a continuation of application No. 08/416,619, filed on Apr. 4, 1995, now abandoned.
(60) Provisional application No. 60/053,761, filed on Jul. 25, 1997.

(51) Int. Cl.$^7$ .......................... H01R 12/04; H05K 1/11
(52) U.S. Cl. ..................................... 174/261; 361/767
(58) Field of Search ................. 174/259, 260, 174/261, 267; 361/767, 774, 779, 760, 768; 228/254

(56) References Cited

U.S. PATENT DOCUMENTS

| 3,244,947 A | 4/1966 | Slater |
| 3,259,814 A | 7/1966 | Green |
| 3,274,458 A | 9/1966 | Boyer et al. |
| 3,316,465 A | 4/1967 | Von Bernuth |
| 3,458,925 A | 8/1969 | Napier et al. |
| 3,461,357 A | 8/1969 | Mutter et al. |
| 3,489,965 A | 1/1970 | Helsdon |
| 3,501,681 A | 3/1970 | Weir |

(List continued on next page.)

FOREIGN PATENT DOCUMENTS

| DE | 42 05 029 | 2/1993 |
| DE | 43 23 799 A1 | 1/1994 |
| DE | 43 23 799 | 1/1994 |

(List continued on next page.)

OTHER PUBLICATIONS

Guckel et al., Electromagnetic actuators with Inductive Position Sensing for Micro Relay, Micro Valve and Precision Positioning Applications, Transducers '95, Eurosensors IX, The 8$^{th}$ International Conference on Solid–State Sensors and Actuators, and Eurosensors IX, pp. 324–327 Jun. 1995.
Hashimoto et al., Thermally Controlled Magnetization Microrelay, Transducers '95, Eurosensors IX, The 8$^{th}$ International Conference on Solid–State Sensors and Actuators, Eurosensors IX, pp. 361–364 Jun. 1995.
Drake et al., An Electostatically Acuated Micro–Relay, Transducers '95, Eurosensors IX,The 8$^{th}$ International Conference on Solid–State Sensors and Actuators, and Eurosensors IX, pp. 380–383 Jun. 1995.

(List continued on next page.)

*Primary Examiner*—Kamane Cuneo
*Assistant Examiner*—Jeremy Norris
(74) *Attorney, Agent, or Firm*—Myers Bigel Sibley & Sajovec

(57) ABSTRACT

A controlled-shaped solder reservoir provides additional solder to a bump in the step for increasing the volume of solder forming the solder bump. The controlled shaped reservoirs can be shaped and sized to provide predetermined amounts of solder to the solder bump. Thus, the height of the resulting solder bump can be predetermined. The solder reservoirs can be shaped to take a minimum amount of space, such as by at least partially wrapping around the solder bump. Consequently, the solder bumps may have increased height without adding to the space requirements of the solder bump, or without increasing the fabrication cost. In addition, due to the finite time required for solder flow, a means of sequencing events during soldering is provided.

28 Claims, 6 Drawing Sheets

U.S. PATENT DOCUMENTS

| | | |
|---|---|---|
| 3,663,184 A | 5/1972 | Wood et al. |
| 3,760,238 A | 9/1973 | Hamer et al. |
| 3,770,874 A | 11/1973 | Krieger et al. |
| 3,871,014 A | 3/1975 | King et al. |
| 3,871,015 A | 3/1975 | Lin et al. |
| 3,916,080 A | 10/1975 | Wakamatsu |
| 3,942,187 A | 3/1976 | Gelsing et al. |
| 3,959,577 A | 5/1976 | Frink |
| 3,993,123 A | 11/1976 | Chu et al. |
| 4,113,578 A | 9/1978 | Del Monte |
| 4,113,587 A | 9/1978 | Chikamori |
| 4,168,480 A | 9/1979 | De Lucia |
| 4,244,002 A | 1/1981 | Sato et al. |
| 4,257,905 A | 3/1981 | Christophorou et al. |
| 4,273,859 A | 6/1981 | Mones et al. |
| 4,449,580 A | 5/1984 | Reisman et al. |
| 4,511,873 A | 4/1985 | Baier et al. |
| 4,545,610 A | 10/1985 | Lakritz et al. |
| 4,563,697 A | 1/1986 | Miura |
| 4,565,901 A | 1/1986 | Hirook et al. |
| 4,661,375 A | 4/1987 | Thomas |
| 4,840,302 A | 6/1989 | Gardner et al. |
| 4,878,611 A | 11/1989 | LoVasco et al. |
| 4,897,508 A | 1/1990 | Mahulikar |
| 4,927,505 A | 5/1990 | Sharma et al. |
| 4,948,754 A | 8/1990 | Kondo et al. |
| 4,950,623 A | 8/1990 | Dishon |
| 4,962,058 A | 10/1990 | Cronin et al. |
| 5,024,372 A | 6/1991 | Altman et al. |
| 5,046,161 A | 9/1991 | Takada |
| 5,048,747 A | 9/1991 | Clark et al. |
| 5,135,155 A | 8/1992 | Kang et al. |
| 5,160,409 A | 11/1992 | Moore et al. |
| 5,162,257 A | 11/1992 | Yung |
| 5,194,137 A | 3/1993 | Moore et al. |
| 5,250,843 A | 10/1993 | Eichelberger |
| 5,293,006 A | 3/1994 | Yung |
| 5,325,265 A | 6/1994 | Turlik et al. |
| 5,327,013 A | 7/1994 | Moore et al. |
| 5,354,711 A | 10/1994 | Heitzmann et al. |
| 5,453,582 A | 9/1995 | Amano et al. |
| 5,475,280 A | 12/1995 | Jones et al. |
| 5,492,235 A | 2/1996 | Crafts et al. |
| 5,547,740 A | 8/1996 | Higdon et al. |
| 5,557,502 A | 9/1996 | Banerjee et al. |
| 5,627,396 A | 5/1997 | James et al. |
| 5,736,456 A | 4/1998 | Akram |
| 5,773,359 A | 6/1998 | Mitchell et al. |
| 5,812,378 A | 9/1998 | Fjelstad |
| 5,851,911 A | 12/1998 | Farnworth |
| 5,892,179 A | 4/1999 | Rinne et al. |
| 5,898,574 A | 4/1999 | Tan et al. |
| 5,923,539 A | 7/1999 | Mitsui et al. |

FOREIGN PATENT DOCUMENTS

| | | |
|---|---|---|
| EP | 0 609 062 A1 | 8/1994 |
| EP | 0 736 972 A1 | 10/1996 |
| FR | 2406893 | 5/1979 |
| FR | 2 705 832 | 12/1994 |
| GB | 1288564 | 9/1972 |
| GB | 2062 963 A | 5/1981 |
| GB | 2 194 387 A | 3/1988 |
| JP | 55-111127 | 8/1980 |
| JP | 57-73952 | 5/1982 |
| JP | 57-197838 | 12/1982 |
| JP | 59-154041 | 9/1984 |
| JP | 61-16552 | 1/1986 |
| JP | 63-222445 | 9/1988 |
| JP | 4-150033 | 5/1992 |
| JP | 07066207 A | 1/1994 |
| WO | WO 93/02831 | 2/1993 |
| WO | WO 93/22475 | 11/1993 |
| WO | WO 96/31905 | 10/1996 |
| WO | WO 98/06118 | 2/1998 |

OTHER PUBLICATIONS

Knuppel, Rugged Design for Reliable Switching: Micro A Relay Sets New Automotive Standards, Components XXIX (1994), No. 4, pp.. 30–32.

Hosaka et al., Electromagnetic Microrelays: Concepts and Fundamental Characteristics, Sensors and Acutators A, 40 (1994), pp. 41–47.

PCB Assembly, Electronic Packaging & Production, vol. 35, No. 1, p. 40 (Jan. 1995).

Adema et al., Flip Chip Technology: A method for providing Known Good Die with High Density Interconnections: MCM '94 Proceedings, pp. 41–49 1994.

Datta et al. Electrochemical Fabrication of Mechanically Robust PbSn C4 Interconnections, J. Electrochem. Soc., vol. 142, No. 11, The Electrochemical Society, Inc., Nov. 1995, pp. 3779–3785.

Hirsch, Tin–Lead, Lead and Tin Platings, Metal Finishing, Guidebook Directory 1987, 55$^{th}$ Guidebook–Directory Issue 1987, Mid Jan. 1987, vol. 85, No. 1A, ISSN 0026–0576, pp. 280–284.

Inaba et al., Solder Bump Formation using Electroless Plating and Ultrasonic Soldering, IEEE Transactions On Components, Hybrids, And Manufacturing Technology, vol. 13, No. 1, Mar. 1990, pp. 119–123.

CONTROLLED-SHAPED SOLDER RESERVOIRS FOR INCREASING THE VOLUME OF SOLDER BUMPS

CROSS-REFERENCE TO RELATED APPLICATIONS

This application is a continuation of co-pending U.S. application Ser. No. 09/122,285 filed Jul. 24, 1998 and entitled "Controlled-Shaped Solder Reservoirs for Increasing the Volume of Solder Bumps, and Structures Formed Thereby," which is a continuation-in-part of U.S. application Ser. No. 08/977,258, now U.S. Pat. No. 5,892,179, filed Nov. 24, 1997, which is a file wrapper continuation of U.S. patent application Ser. No. 08/416,619, filed Apr. 4, 1995, now abandonded. In addition, this application claims benefit of U.S. Provisional Application No. 60/053,761, now abandoned entitled "Controlled-Shaped Solder Reservoirs for Increasing the Volume of Solder Structures," filed Jul. 25, 1997.

FIELD OF THE INVENTION

This invention relates to the field of microelectronic devices, and more particularly to solder bumps for microelectronic devices.

BACKGROUND OF THE INVENTION

High performance microelectronic devices often use solder balls or solder bumps for electrical and mechanical interconnection to other microelectronic devices. For example, a very large scale integration (VLSI) chip may be electrically connected to a circuit board or other next level packaging substrate using solder balls or solder bumps. This connection technology is also referred to as "Controlled Collapse Chip Connection—C4" or "flip-chip" technology, and will be referred to herein as "solder bumps".

A significant advance in this technology is disclosed in U. S. Pat. No. 5,162,257 to Yung entitled "Solder Bump Fabrication Method" and assigned to the assignee of the present invention. In this patent, an under bump metallurgy is formed on the microelectronic substrate including contact pads, and solder bumps are formed on the under bump metallurgy opposite the contact pads. The under bump metallurgy between the solder bumps and the contact pads is converted to an intermetallic which is resistant to etchants used to etch the under bump metallurgy between solder bumps. Accordingly, the base of the solder bumps is preserved.

In many circumstances, it may be desired to provide a solder bump on the substrate at a location remote from the contact pad and also form an electrical connection between the contact pad and the solder bump. For example, a microelectronic substrate may be initially designed for wire bonding with the contact pads arranged around the outer edge of the substrate. At a later time it may be desired to use the microelectronic substrate in an application requiring solder bumps to be placed in the interior of the substrate. In order to achieve the placement of a solder bump on the interior of the substrate away from the respective contact pad, an interconnection or redistribution routing conductor may be necessary.

U.S. Pat. No. 5,327,013 to Moore et al. entitled "Solder Bumping of Integrated Circuit Die" discloses a method for forming a redistribution routing conductor and solder bump on an integrated circuit die. This method includes forming a terminal of an electrically conductive, solder-wettable composite material. The terminal includes a bond pad overlying the passivation layer remote from a metal contact and a runner that extends from the pad to the metal contact. A body of solder is reflowed onto the bond pad to form a bump bonded to the pad and electrically coupled through the runner.

In this method, however, the solder bump is formed by pressing a microsphere of a solder alloy onto the bond pad. In addition, the spread of solder along the runner during reflow is limited. In the illustrated embodiment, a solder stop formed of a polymeric solder resist material is applied to the runner to confine the solder to the bond pad.

In many circumstances, it is desirable to form relatively tall solder bumps. For example, taller solder bumps provide a larger opening between a microelectronic chip and substrate in a flip-chip module, which facilitates improved cleaning and underfill. In addition, it is generally excepted that taller solder bumps are more reliable because the straining per unit length is proportionally reduced with the increase in bump height.

A known technique for increasing solder bump height is to increase the volume solder with the same diameter solder pad. However, this technique typically requires more space on the substrate for plating or depositing the additional solder, and/or requires additional process steps. As a consequence, the benefit of increasing the bump height is often offset, at least in part, by the increase in surface area required for a single bump, and or, the additional cost associated with providing additional solder. Other methods of decreasing the strain per unit length in the solder includes casting pillars, posts, or beams of high melting point solder and attaching these to the semiconductor using lower temperature solders.

Notwithstanding the above mentioned references, there continues to exist a need in the art for solder bump structures that are relatively tall, do not require additional surface area, and can be fabricated efficiently and at a reduced cost.

SUMMARY OF THE INVENTION

It is therefore an object of the present invention to provide an improved solder bump structure.

It is another object of the present invention to provide solder bump structure with a solder redistribution reservoir for increasing the volume, and thus the height, of the solder bump.

It is another object of the present invention to provide an improved vacuum in a sealed chamber including a microelectronic device.

These and other objects are provided, according to the present invention, by a controlled-shaped solder reservoir which provides additional solder to a bump in the reflow step for increasing the volume of solder forming the solder bump. The controlled shaped reservoirs can be shaped and sized to provide predetermined amounts of solder to the solder bump. Thus, the height of the resulting solder bump can be predetermined, not to mention that the height is greater than that of similar solder bumps without solder redistribution reservoirs because of the additional solder volume added by the reservoirs. To accommodate the stringent space requirement in many microelectronic chip designs, the solder reservoir can be shaped to take a minimum amount of space. Consequently, the solder bumps may have increased height without adding to the space requirements of the solder bump, or without increasing the cost.

Other advantages of the solder structures formed in accordance with the present invention include an increase opening or gap in a flip-chip structure because of the taller solder bumps. This allows for more efficient cleaning of flux and other residues, and more efficient underfilling. The taller solder bumps can also be utilized in conjunction with electrical contact bumps that do not have solder reservoirs so that the contact bumps are elongated by the relatively larger bumps formed with the assistance of the additional solder from the reservoirs. Consequently, the contact bumps are more reliable because the strain is distributed over a greater length (i.e., height) because of the relatively larger volume bumps. Yet another advantage is that the relatively taller solder bumps can be utilized to increase the volume, and thus reduce the pressure, of a sealed chamber in a MEMS vacuum package. This enables a lower pressure vacuum environment to the generated without the equipment typically needed to generate such low pressures vacuums. Further, a single masking step can be used to define both the solder bump structure, including the solder redistribution reservoir, and the under bump metallurgy layer.

In accordance with one embodiment of the present invention, a solder structure on a microelectronic substrate comprises a solder reservoir portion and a solder bump portion, and wherein the solder reservoir portion is non-linear in shape. The solder reservoir portion may wrap around the solder bump portion in order to take up less space. In addition, the solder structure may comprise a plurality of solder reservoir portions extending from the solder bump portion. Preferably, the radially extending solder reservoirs are of substantially equal length, though the reservoirs can be of varying lengths.

Further, the solder reservoir portion may be shaped to create a pressure gradient along the length of the solder reservoir portion during a solder reflow process. Accordingly, the rate of solder flow can be controlled, which may be highly desirable in particular circumstances. The pressure gradient may increase the flow rate of solder to the solder bump portion, or the pressure gradient may decrease the flow rate of solder to the solder bump portion.

In order to reduce the area taken by the solder bump structure, the solder reservoir portion may include a notch for facilitating the removal of the residual solder of the solder reservoir portion subsequent to the solder reflow process. The removal of the residual solder may be further facilitated by the use of high-lead solders which may facilitate the incomplete conversion of copper in the under bump metallurgy. Thus, the remaining copper may be dissolved in the subsequent etch step, thereby allowing the residual solder of the reservoir to break off at the weak point created by the notch, and float away in the etchant.

In accordance with another aspect of the present invention, a solder structure on a microelectronic substrate comprises a solder reservoir portion and a solder bump portion, and wherein the solder reservoir portion has a width which is non-uniform in at least a portion of the reservoir portion. Accordingly, a pressure gradient can be achieved within the solder reservoir to either increase or decrease the flow rate of the solder to the bump structure during the solder flow process. As mentioned above, controlling the flow rate of the solder in the solder flow process may be desirable in certain applications.

In accordance with yet another aspect of the present invention, a microelectromechanical system (MEMS) module comprises a substrate and a lid in spaced apart relationship, a solder ring which bonds the lid to the substrate to define a sealed chamber therebetween, wherein the solder ring includes at least one solder reservoir associated therewith. In addition, the device includes a MEMS device formed in the chamber.

A second solder ring that is concentrically aligned with the first solder ring may be included, wherein the second solder ring also includes at least one solder reservoir associated therewith. The MEMS module may further comprise elongated electrical contacts within the chamber, wherein the elongated electrical contacts electrically connect the lid to the substrate. Preferably, the chamber is a controlled environment maintained at a vacuum.

In accordance with another aspect of the present invention, a flip-chip structure comprises a substrate and a chip in spaced apart relationship, an elongated contact bump which electrically connects the lid to the substrate, and a plurality of mechanical bumps bonding the chip to the substrate, wherein the mechanical bumps include solder reservoirs associated therewith. The solder reservoirs associated with the mechanical bumps may be non-linear, and may have a non-uniform width portion, as discussed above.

A method in accordance with the present invention for forming a solder bump structure on a microelectronic substrate comprises the steps of forming an under bump metallurgy layer on the microelectronic substrate, and forming a solder structure on the under bump metallurgy layer opposite the microelectronic substrate, wherein the solder structure includes a non-linear solder reservoir portion and a solder bump portion. The step of forming the solder structure may include the step of forming a solder structure including a plurality of solder reservoirs. In addition, the step of forming the solder structure may include the step of forming a solder bump portion and a reservoir which at least partially wraps around the solder bump portion. Yet further, the step of forming the solder structure may include the step of forming a solder structure including a solder reservoir shaped to create a pressure gradient along a length of the solder reservoir.

In accordance with another aspect of the present invention, a method of forming a solder bump structure on a microelectronic substrate comprises the steps of forming an under bump metallurgy layer on the microelectronic substrate, and forming a solder structure on the under bump metallurgy layer opposite the microelectronic substrate, wherein the solder structure included a solder bump portion and a plurality of solder reservoir portions extending therefrom.

In accordance with yet another aspect of the present invention, a method for forming a flip-chip module comprises the steps of forming a contact solder bump structure on a microelectronic substrate, forming a plurality of mechanical solder bump structures on the microelectronic substrate, wherein said mechanical solder bump structures have respective solder reservoirs associated therewith. Since the flow of molten solder from the reservoir to the bump takes time, the present invention provides a means for sequencing aspects of the soldering operation. Further, the method includes the steps of mating the microelectronic substrate to a second substrate, and reflowing the solder of the contact solder bumps and the mechanical solder bumps to bond the microelectronic substrate to the second substrate, wherein the contact solder bump becomes elongated due to the relatively larger mechanical solder bumps that will form after a brief delay.

In accordance with another aspect of the present invention, a method of forming a flip-chip module comprises the steps of forming a solder ring on a microelectronic substrate, wherein said solder ring includes at least one solder reservoir associated therewith, mating the microelectronic substrate to a second substrate in a vacuum environment to define a chamber therebetween, and reflowing the solder of the solder ring to seal the microelectronic substrate to the second substrate and to increase the volume of the chamber. Thus, because of the increased volume of the sealed chamber, the chamber is at a relatively lower pressure than the vacuum environment. The method may further include the step of forming a second solder ring substantially concentrically aligned with the solder ring, wherein the second solder ring includes at least one solder reservoir associated therewith.

Other features and advantages of the present invention will become apparent to one that is skilled in the art upon examination of the following drawings and detailed description. It is intended that all such additional features and advantages be included herein within the scope of the present invention, as defined in the appended claims.

DETAILED DESCRIPTION OF PREFERRED EMBODIMENTS

Figure 6:
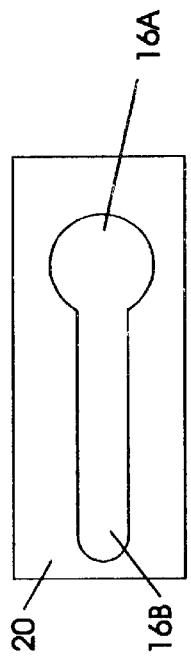
FIGS. 6–10 are top views of a microelectronic substrate at various stages during the manufacture of a redistribution routing conductor corresponding respectively to FIGS. 1–5.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

I. Redistribution Routing Conductors

Figure 5:
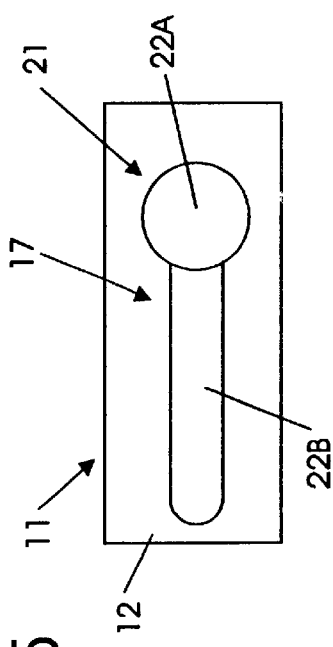
Figure 10:
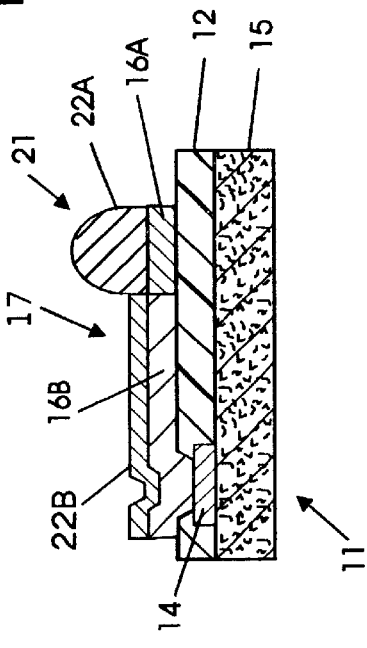

A microelectronic structure 11 includes a redistribution routing conductor and a raised solder bump, as shown from the side in FIG. 5 and as shown from the top in corresponding FIG. 10. The microelectronic structure includes a contact pad 14 and passivation layer 12 on a substrate 15. The redistribution routing conductor 17 and solder bump 21 each include respective portions of under bump metallurgy layer 16A–B and solder layer 22A–B.

The redistribution routing conductor 17 includes a relatively elongate solder portion 22B (also referred to herein as a solder reservoir) on a respective elongate under bump metallurgy portion 16B. The solder bump 21 includes an enlarged width solder portion 22A on a respective enlarged width under bump metallurgy portion 16A. Preferably the elongate solder portion 22B is relatively thin while the enlarged width solder portion 22A is raised, as shown in FIG. 5.

Accordingly, the solder bump 21 can be located at a point on the substrate relatively distant from the contact pad 14 with the redistribution routing conductor 17 providing an electrical connection therebetween. This arrangement provides the advantage that a substrate having a layout with a contact pad 14 at one predetermined location can have an associated solder bump at a second location. This can be particularly useful, for example, when a substrate has a layout with contact pads arranged for wire bonding, and it is desired to use the substrate in a flip-chip application. This solder bump and redistribution routing conductor can be fabricated simultaneously, as described below with regard to FIGS. 1–10.

While the redistribution routing conductor 17 can be straight as shown, it may also include bends and curves. Furthermore, the solder bump 21 may be circular as shown or it can have other shapes such as rectangular.

Figure 1:
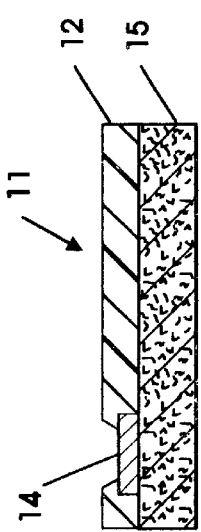
FIGS. 1–5 are cross sectional side views of a microelectronic substrate at various stages during the manufacture of a redistribution routing conductor according to the present invention.

The solder bump 21 and the redistribution routing conductor 17 are preferably formed simultaneously. FIGS. 1–5 are cross-sectional side views of microelectronic structures at various stages of fabrication, while FIGS. 6–10 are corresponding top views of the same microelectronic structures. The microelectronic structure 11 initially includes a passivation layer 12 and an exposed contact pad 14 on a substrate 15, as shown in FIGS. 1 and 6.

The substrate 15 can include a layer of a semiconducting material such as silicon, gallium arsenide, silicon carbide, diamond, or other substrate materials known to those having skill in the art. This layer of semiconducting material can in turn include one or more electronic devices such as transistors, resistors, capacitors, and/or inductors. The contact pad 14 may comprise aluminum, copper, titanium, an intermetallic including combinations of the aforementioned metals such as AlCu and AlTi$_3$, or other materials known to those having skill in the art. This contact is preferably connected to an electronic device in the substrate.

The passivation layer 12 can include polyimide, silicon dioxide, silicon nitride, or other passivation materials known to those having skill in the art. As shown, the passivation layer 12 may cover top edge portions of the contact pad 14 opposite the substrate 15, leaving the central portion of the contact pad 14 exposed. As will be understood by those having skill in the art, the term substrate may be defined so as to include the passivation layer 12 and contact pad 14 of FIGS. 1 and 6.

Figure 7:
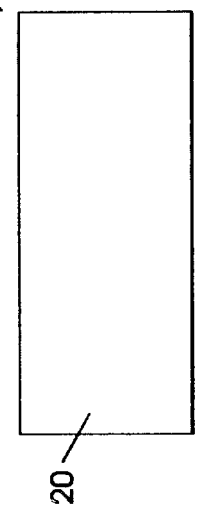
Figure 2:
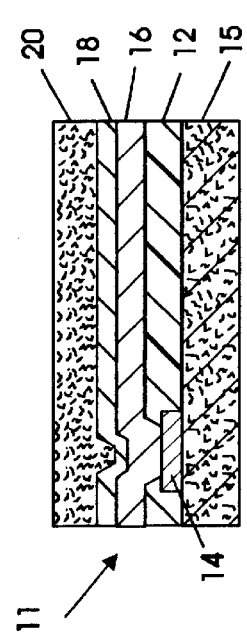

An under bump metallurgy layer 16 is formed on the passivation layer to provide a connection between the solder bump and the contact pad 14 and to provide a plating electrode, as shown in FIGS. 2 and 7. The under bump metallurgy layer 16 also protects the contact pad 14 and passivation layer 12 during subsequent processing steps, and provides a surface to which the solder will adhere. The under bump metallurgy layer preferably includes a chromium layer on the passivation layer 12 and contact pad 14; a phased chromium/copper layer on the chromium layer; and a copper layer on the phased layer. This structure adheres to and protects the passivation layer 12 and contact pad 14, and also provides a base for the plated solder which follows.

The under bump metallurgy layer may also include a titanium barrier layer between the substrate and the chromium layer as disclosed in U. S. Pat. No. 5,767,010 entitled "Solder Bump Fabrication Methods and Structures Including a Titanium Barrier Layer," and assigned to the assignee of the present invention. This titanium barrier layer protects the passivation layer from etchants used to remove the other components of the under bump metallurgy layer and also prevents the formation of residues on the passivation layer which may lead to shorts between solder bumps and redistribution routing conductors. The titanium layer can be easily removed from the passivation layer without leaving significant residues.

Various under bump metallurgy layers are disclosed, for example, in U.S. Pat. No. 4,950,623 to Dishon entitled "Method of Building Solder Bumps", U.S. Pat. No. 5,162,257 to Yung entitled "Solder Bump Fabrication Method", and U.S. Pat. No. 5,767,010 to Mis et al. entitled "Solder Bump Fabrication Methods and Structures Including a Titanium Barrier Layer." Each of these references is assigned to the assignee of the present invention, and the disclosure of each is hereby incorporated in its entirety herein by reference.

A solder dam 18 can be formed on the under bump metallurgy layer 16. This solder dam 18 preferably includes a layer of a solder non-wettable material such as titanium or chromium on the under bump metallurgy layer 16. The solder dam 18 will be used to contain the solder if a reflow step is performed prior to removing the first (exposed) portion of the under bump metallurgy layer 16 not covered by solder, as discussed below. A mask layer 20 is then formed on the solder dam 18. The mask layer may comprise a photoresist mask or other mask known to those having skill in the art.

Figure 8:
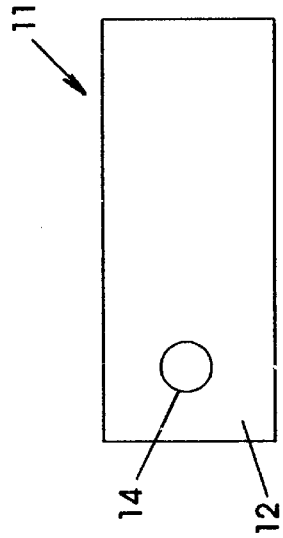
Figure 3:
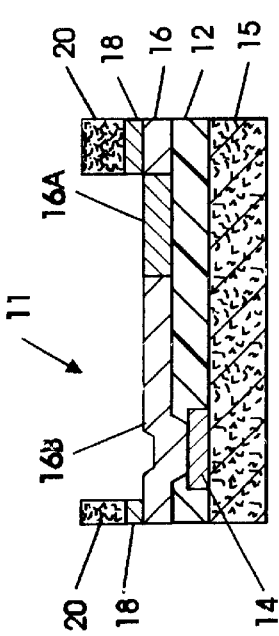

The mask layer 20 is patterned to cover the solder dam over the first portion of the under bump metallurgy layer and to uncover areas of the solder dam 18 over a second portion of the under bump metallurgy layer 16 on which the solder bump and redistribution routing conductor will be formed. The uncovered portion of the solder dam is then removed thereby uncovering the second portion of under bump metallurgy layer 16, as shown in FIGS. 3 and 8. More particularly, the second portion of the under bump metallurgy layer 16, which is not covered by the solder dam and patterned mask layer, includes an enlarged width portion 16A and an elongate portion 16B.

Figure 4:
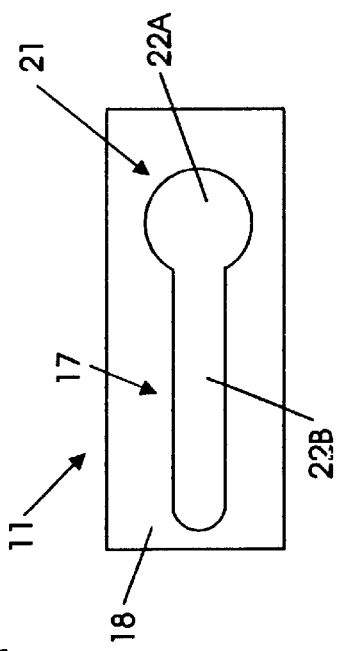
Figure 9:
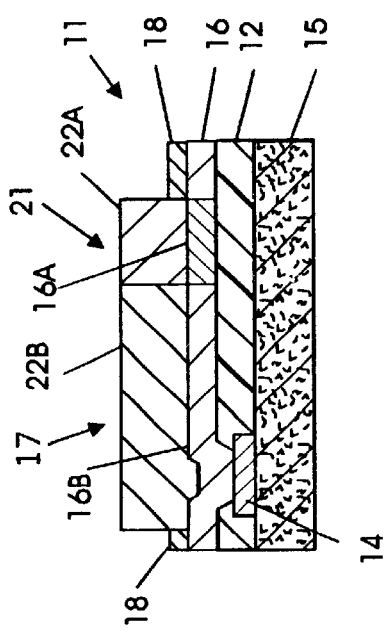

A solder layer 22 is preferably electroplated on the second portion of the under bump metallurgy layer 16, as shown in FIGS. 4 and 9. The solder can be electroplated by applying an electrical bias to the continuous under bump metallurgy layer 16 and immersing the microelectronic structure in a solution including lead and tin, as will be understood by those having skill in the art. This electroplating process allows solder layers to be formed simultaneously on a plurality of second portions of the under bump metallurgy layer 16. The solder will not plate on the mask layer 20. Alternatively, the solder can be applied by screen printing as a paste, by evaporation, by e-beam deposition, by electroless deposition or by other methods known to those having skill in the art. In addition, while lead-ti solder is used for purposes of illustration throughout the specification, other solders such as gold solder, lead-indium solder, or tin solder can be used as will be understood by those having skill in the art.

The solder layer 22 includes an elongate portion 22B and an enlarged width portion 22A. After removing the mask layer 20, the microelectronic structure 11 can be heated causing the solder to flow from the elongate solder portion 22B to the enlarged width solder portion 22A thereby forming a raised solder bump at the enlarged width solder portion 22A. The solder dam 18 prevents the solder from spreading beyond the elongate 16B and enlarged width 16A portions of the under bump metallurgy layer 16, as shown in FIGS. 5 and 10.

The solder will flow when heated above its liquidous temperature (approximately 299° C. for solder having 90% lead and 10% tin), and this process is commonly referred to as solder reflow. During reflow, the surface tension of the solder creates a relatively low internal pressure in the enlarged width solder portion 22A over the relatively wide geometry provided for the solder bump, and a relatively high internal pressure in the elongate solder portion 22B over the relatively narrow geometry provided for the redistribution routing conductor.

In order to equalize this internal pressure differential, solder flows from the elongate solder portion 22B to the enlarged width solder portion 22A. Accordingly, the solder forms a raised solder bump at the enlarged width solder portion 22A and a relatively thin layer of solder at the elongate solder portion 22B over the redistribution routing conductor. When the solder is cooled below its liquidus temperature, it solidifies maintaining its shape including the raised solder bump and the thin layer of solder over the redistribution routing conductor.

It is known in the art of printed circuit board manufacture to apply solder at a uniform level on PCB lands by screen printing, and that the level of solder can be increased locally by enlarging a part of the land. See, Swanson, "PCB Assembly: Assembly Technology in China," *Electronic Packaging & Production*, pp. 40, 42, January 1995. To their knowledge, however, Applicants are the first to realize that solder can be electroplated on a microelectronic substrate at a uniform level and then heated to produce a raised solder bump together with a redistribution routing conductor on the substrate.

Furthermore, U.S. Pat. No. 5,327,013 to Moore et al. states that a microsphere of a solder alloy can be pressed onto a pad, and that a stop formed of a polymeric solder resist material can be applied to the runner to confine the solder to the bond pad. While this patent states that the spread of solder along the runner during reflow can be limited by constricting the width of the runner section relative to the bond pad, there is no suggestion that the relative dimensions of the runner section and the bond pad can be used to cause solder to flow from the runner to the bond pad thereby forming a multilevel solder structure. In addition, neither of these references suggest that a solder structure having an elongate portion and an enlarged width portion can be used to mask the under bump metallurgy layer in order to form a redistribution routing conductor together with a raised solder bump using only a single masking step.

The method described herein relies on differences in the surface-tension induced internal pressure of the reflowed (liquid) solder to form a thin layer of solder at the elongate solder portion 22B and a raised solder bump at the enlarged width solder portion 22A. The internal pressure P of a liquid drop of solder can be determined according to the formula:

$$P=2T/r,$$

where T is the surface tension of the liquid solder, and r is the radius of the drop.

Where liquid solder is on a flat wettable surface such as the under bump metallurgy layer, the formula becomes:

$$P=2T/r'.$$

In this formula, r' is the apparent radius of the liquid solder, and the apparent radius is the radius of the of the arc (radius of curvature) defined by the exposed surface of the solder. The apparent radius is dependent on the width of the underlying solder wettable layer such as the second portion of the under bump metallurgy layer which is in contact with the solder. Accordingly, the internal pressure of a reflowed solder structure is inversely proportional to the width of the second portion of the under bump metallurgy in contact with the solder. Stated in other words, a solder portion having on a relatively wide under bump metallurgy portion will have a relatively low internal pressure while a solder portion on an elongate (relative narrow) under bump metallurgy portion will have a relatively high internal pressure. The internal pressures will equalize when the apparent radii of the elongate solder portion 22B and the enlarged width solder portion 22A are approximately equal.

Accordingly, when the solder layer 22 with a uniform level illustrated in FIGS. 4 and 9 is heated above its liquidus temperature, solder flows from the elongate solder portion 22B to the enlarged width solder portion 22A until each portion has approximately the same apparent radius thereby forming a raised solder bump. If the solder flow step is performed prior to removing the first portion of the under bump metallurgy layer 16 not covered by the solder structure, an intermetallic can be formed between the solder portions 22A–B and under bump metallurgy portions 16A–B adjacent the solder wherein the intermetallic is resistant to etchants commonly used to remove the under bump metallurgy. Accordingly, this intermetallic reduces undercutting of the solder during the following step of removing the first portion of the under bump metallurgy not covered by solder, as discussed in U. S. Pat. No. 5,162,257 to Yung entitled "Solder Bump Fabrication Method" and assigned to the assignee of the present invention.

Preferably, the under bump metallurgy layer 16 includes a copper layer adjacent the solder structure and the solder is a lead-tin solder. Accordingly, the step of causing the solder to flow will cause the solder to react with the copper to form an intermetallic region adjacent the solder structure, and this intermetallic will comprise $Cu_3Sn$. This intermetallic does not readily react with etchants commonly used to remove under bump metallurgy layers thereby reducing undercutting of the solder structure.

The solder layer 22 is then preferably used as a mask to selectively etch the first portions of the solder dam 18 and under bump metallurgy 16 not covered by solder. A chemical etchant can be used which etches the under bump metallurgy layer 16 preferentially with respect to the solder portions 22A–B. Accordingly, no additional masking step is required to pattern the under bump metallurgy layer. Stated in other words, the formation of mask layer 20 is the only masking step required to pattern the solder dam 18 (FIGS. 3 and 8), selectively expose the second portion of the under bump metallurgy layer 16 during the plating step (FIGS. 3 and 8), and remove the first portions of the under bump metallurgy layer not covered by solder after the plating step (FIGS. 5 and 10).

Alternately, the first portions of the under bump metallurgy layer 16 not covered by solder portions 22A and 22B can be selectively removed prior to causing the solder to flow. In this case, the elongate 22B and enlarged width 22A solder portions are respectively supported on only the elongate 16B and enlarged width 16A under bump metallurgy portions, and while the liquid solder is wettable to the under bump metallurgy, it is not wettable to the passivation layer 12. Accordingly, the passivation layer can contain the solder during the solder flow step, and the solder dam 18 can be eliminated.

In another alternative, the solder dam can include a solder non-wettable layer on the under bump metallurgy layer 16 and a solder wettable layer, such as copper, on the solder non-wettable layer opposite the under bump metallurgy layer, as disclosed in U. S. Pat. No. 5,767,010 to Mis et al. entitled "Solder Bump Fabrication Methods and Structures Including a Titanium Barrier Layer". The solder wettable layer allows solder to be plated on portions of the solder dam as well as the second portion of the under bump metallurgy layer not covered by the solder dam or mask.

Accordingly, the mask layer 20 can uncover portions of the solder dam as well as portions of the under bump metallurgy layer 16 thereby allowing a greater volume of solder to be plated. The mask layer 20 and underlying portions of the solder wettable layer are then removed. When heat is applied to cause the solder to flow, the remaining portion of the solder wettable layer under the solder will be dissolved into the solder exposing the solder to the solder non-wettable layer. Accordingly, the solder will retreat to the second portion of the under bump metallurgy layer which is wettable.

As an example, a first portion of the under bump metallurgy layer 16 is covered by a solder dam 18 and a mask layer 20. A second portion of the under bump metallurgy layer 16 is uncovered and has an elongate portion 16B that is 150 micrometers wide and 500 micrometers long, and a circular enlarged width portion 16A with a 500 micrometers diameter (or width), as shown in FIGS. 3 and 8. A uniform 35 micrometers high solder layer 22 is then electroplated on the second portion of the under bump metallurgy layer 16 including elongate portion 16A and enlarged width portion 16B, as shown in FIG. 4. This solder is 90% lead and 10% tin. After removing the mask layer 20, the solder is heated above its liquidus temperature (approximately 299° C.) allowing it to flow.

The liquid solder is contained on the second portion 16A–B of the solder wettable under bump metallurgy layer by the solder dam 18 to which the solder will not wet. Because the solder structure has varying widths, the internal pressure of the solder structure is not consistent when the height is uniform. In particular, the internal pressure of the elongate solder portion 22B is relatively high (approximately $1.283 \times 10^4$ Pa or 1.86 psi) and the internal pressure of the enlarged width solder portion 22A is relatively low (approximately $3.848 \times 10^3$ Pa or 0.558 psi) at the original solder height.

Accordingly, solder flows from the elongate solder portion 22B to the enlarged width solder portion 22A until the internal pressures equalize, thereby forming a raised solder bump at the enlarged width solder portion 22A, as shown in FIGS. 5 and 10. In FIGS. 5 and 10, the solder dam 18 and the first portion of the under bump metallurgy layer 16 not covered by the solder structure have also been removed.

In this example, equilibrium is obtained at an internal pressure of approximately $3.4 \times 10^3$ Pa (0.493 psi). At equilibrium, the elongate solder portion 22B is approximately 10 micrometers high and the enlarged width solder portion 22A is approximately 130 micrometers high, and both portions have a radius of curvature of approximately 281 micrometers. Accordingly, a two level solder structure can be provided with a single masking step. When cooled, this structure solidifies while maintaining its form. In addition, the elongate solder portion 22B with a solder height of 10 micrometers is sufficient to mask the respective elongate under bump metallurgy layer portion 16B when removing the first portion of the under bump metallurgy layer not covered by solder. The enlarged width portion of the solder structure may have a width (or diameter if the enlarged width portion is circular) of at least two times a width of the elongate portion of the solder structure in order to ensure that the solder bump formed by the method described above is sufficiently raised relative to the elongate solder portion to provide an adequate connection to a printed circuit board.

In the drawings and specification, there have been disclosed typical preferred embodiments of the invention and, although specific terms are employed, they are used in a generic and descriptive sense only and not for purposes of limitation, the scope of the invention being set forth in the following claims.

II. Controlled-Shaped Solder Reservoirs

As described above, the elongate solder portion 22B functions as a solder redistribution reservoir for the enlarged with solder portion 22A. The surface-tension induced pressure differential causes the molten solder in a relatively high pressure elongate solder portion 22B to flow to the relatively lower pressure enlarged width portion 22A. The increasing solder volume at the enlarged width portion 22A forms a raised solder bump. A solder bump so formed generally has a relatively larger height than solder bumps formed without solder redistribution reservoirs when utilizing the same pad diameter and solder plating thickness. Thus, by taking advantage of the surface-tension induced pressure differential between a solder redistribution reservoir and an elongate width portion, such as a solder bump, relatively taller bumps can be advantageously achieved. The following description is of various embodiments of solder structures which take advantage of this pressure differential to produce more efficient and reliable solder structures.

Figure 11:
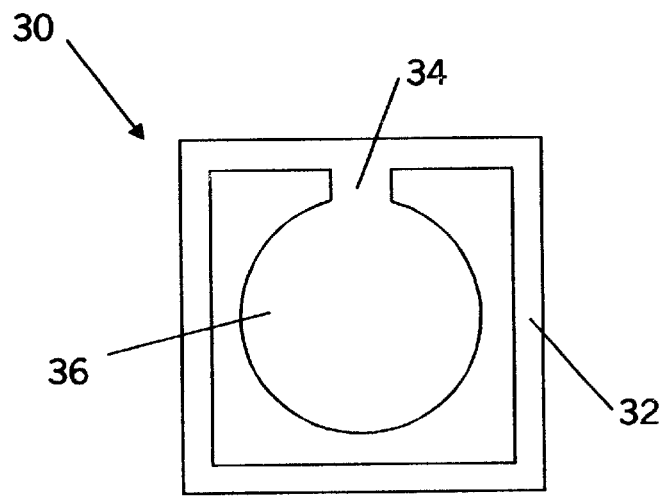
FIGS. 11–16 are top plan views of various embodiments of controlled shaped solder reservoirs in accordance with the present invention.

With reference to FIG. 11, a solder structure 30 in accordance with the present invention as illustrated. The solder structure 30 includes a square solder redistribution reservoir 32, and a channel 34 that connects the solder redistribution reservoir 32 to an enlarged with portion, such as bump 34. Accordingly, as a solder forming the solder structure is heated to its liquidus state to cause the solder to flow, commonly referred to as solder reflow, the solder flows from the solder redistribution reservoir 32 to the bump 36 via the channel 34 due to the internal pressure differential. The additional solder from the solder redistribution reservoir 32 increases the volume of solder forming the solder bump, thereby forming a relatively taller solder bump. Thus, the space between adjacent bumps in an area array can be utilized to store the solder that flows into the bumps during reflow.

As an example, assume an area array flip chip with 0.125 mm diameter pads on a 0.25 mm pitch, a minimum spacing for features in the plating template of 0.025 mm, and plating solder that is 0.05 mm thick. A solder bump under these circumstances would have a solder volume of 6.4 E-4 mm$^3$, and a height of 0.07 mm. However, by providing a solder redistribution reservoir 32 around the solder bump pad, as shown in FIG. 11, that is 0.063 mm wide and 0.25 mm square, the bump volume increases to 1.23 E-3 mm$^3$. Accordingly, solder bump height is significantly increased while not affecting the solder bump pitch in the array.

It is noted that the solder structure 30, and those structures discussed below, is preferably fabricated with the single mask process described above, though it will be recognized by those of ordinary skill in the art that other suitable solid, liquid, vapor, and electromechanical deposition methods may be utilized, as well known in the art. Further, it is noted that while the solder bumps described herein are circular in shape, one having ordinary skill in the art will recognize that the solder bumps may take any geometry, such as square, rectangular or polygonal.

Figure 12:
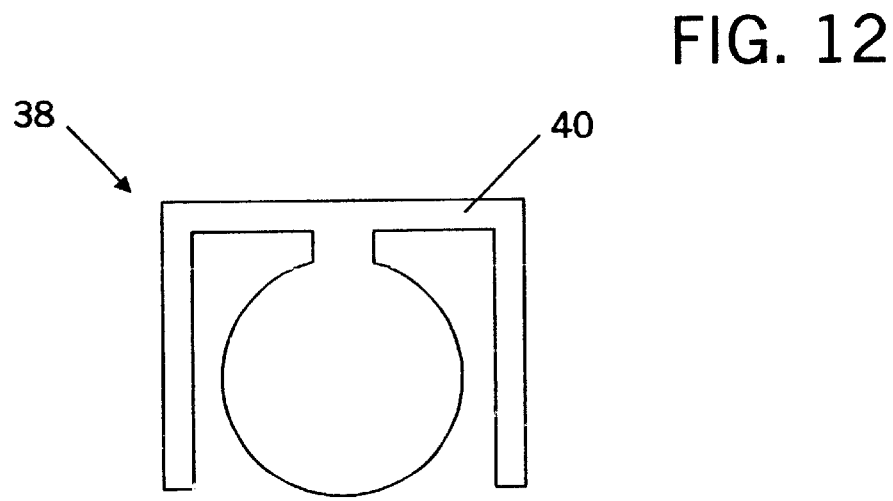
Figure 13:
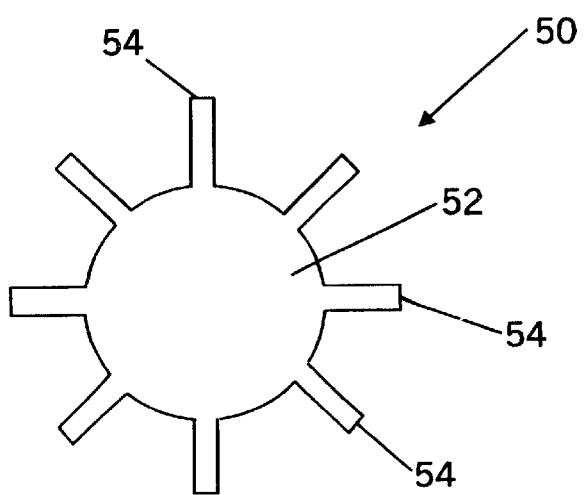

It is further noted that while a solder redistribution reservoir 32 is square, other geometries for the solder redistribution reservoir are within the scope of the present invention. The different geometries and dimensions of the solder redistribution reservoir may be controlled by various design parameters, such as the amount of solder to be added, the speed of flow, the minimum feature spacing, etc. For instance, as illustrated in FIG. 12, a solder structure 38 includes a U-shaped solder redistribution reservoir 40 of the same width as the solder redistribution reservoir 32 may be utilized in order to provide additional solder to the bump. As another example, a solder structure 50 comprises a bump portion 52 in a plurality of regularly extending solder redistribution reservoirs 54, as illustrated in FIG. 13. Thus, by engineering the particular dimensions in shape of the solder redistribution reservoir, the volume, height, and area of the solder bump can be precisely controlled.

Figure 14:
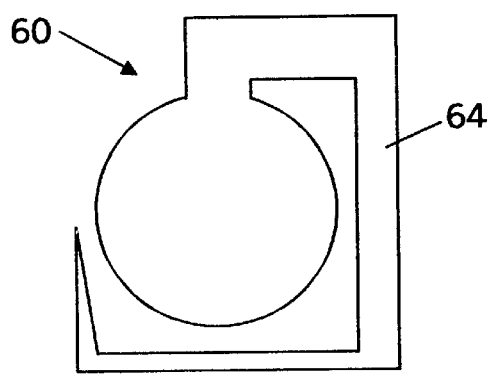
Figure 15:
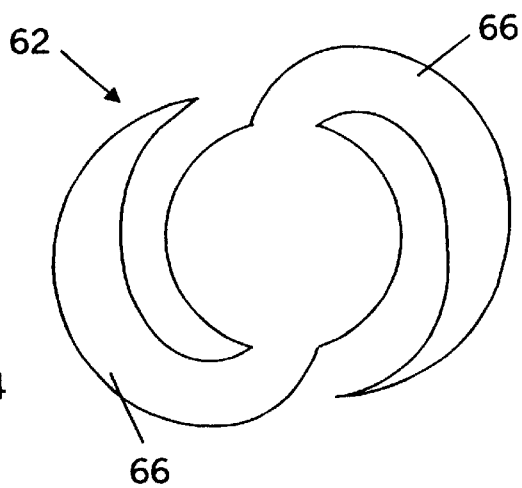
Figure 16:
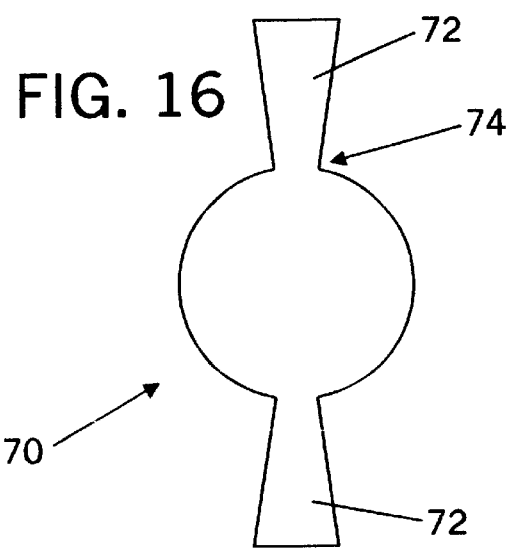
Figure 17:
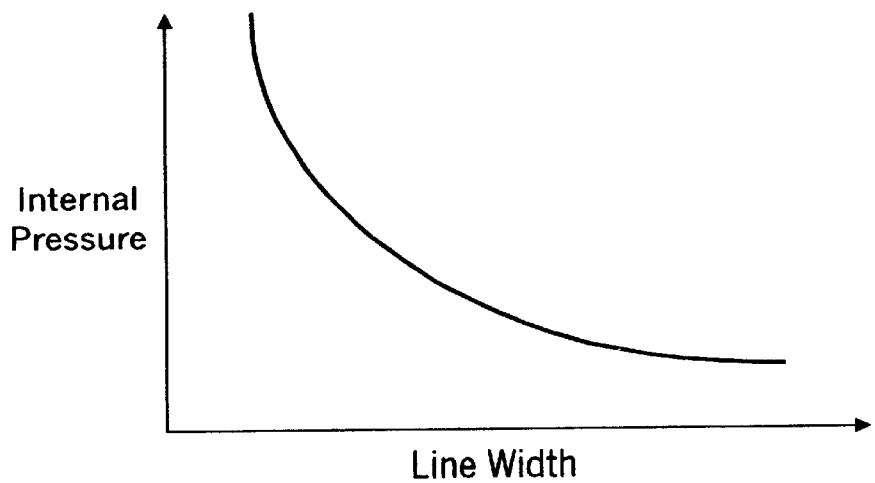
FIG. 17 is a graph illustrating the relationship of the reservoir width and the internal pressure of the solder.

It is believed that the solder lines forming the solder redistribution reservoirs may reach a critical length where the efficiency of the solder flow begins to decreases. To improve flow at or near this critical length, and/or to better control the flow rate of the solder, a gradient line width may be utilized, as illustrated in FIGS. 14–16. As shown in FIG. 17, the line width and internal pressure are essentially inversely proportional. Thus, by designing the solder redistribution reservoir to have an increasing line width from a distal end to a proximate end adjacent the bump, the flow rate of the solder will be increased. An increase in the flow rate may be desirable with solder having a wide range of plastic flow so that the solder can be moved before it is completely molten. As illustrated in FIGS. 14 and 15, solder structures 60 and 62, include solder redistribution reservoir 64 and 66, respectively, which have continuous line width gradients. It is noted, however, that continuous line width gradients are not necessary for the present invention. The line width gradient may be in only a portion of the solder lines forming the solder redistribution reservoir.

Alternatively, the solder redistribution reservoir may have a line width that decreases from a distal end to a proximate end adjacent the solder bump in order to decrease the flow rate, as illustrated by the solder structure 70 having solder redistribution reservoirs 72. Slowing the flow rate of the solder in the solder redistribution reservoirs may be desirable in various circumstances, such as with eutectic solders where rapid flow produces instabilities and unpredictability. Specifically, the instability and unpredictability with eutectic solders is caused by a variety of factors, such as not all the solder melting simultaneously, grains of higher melting point alloys, etc.

As discussed above, a small amount of solder remains in the solder redistribution reservoir after reflow. Even though the solder redistribution reservoirs described herein can be shaped and sized to take very little space on a substrate, it may still be desirable to remove the solder redistribution reservoirs after the reflow step. In accordance with the present invention, by inhibiting the complete conversion of the copper (or other wettable metal)layer of the under bump metallurgy to an intermetallic, the remaining copper may be removed in the under bump metallurgy etch step. The removal of the copper allows the residual solder of the solder redistribution reservoir to break off and float away in the under bump metallurgy etchant. A small area of the solder redistribution reservoir may have a narrow width or notch 74 (FIG. 16) which creates a weak point at which the solder reservoir will break off, thereby controlling the breaking point.

By way of example, one method of causing incomplete conversion of the copper in the metallurgy layer is to use a high-lead solder. Another technique involves the use of rapid solder flow, as achievable via the techniques described above, so that there is insufficient tin left in the residual solder in the solder redistribution reservoir to complete the conversion of the copper. However, it is noted that other techniques may be utilized to prevent the complete conversion of the copper, thereby creating a sacrificial copper layer that release the solder redistribution reservoir of the substrate.

Advantageously, solder bumps fabricated utilizing the solder redistribution reservoirs in accordance with the present invention are taller than solder bumps without a solder redistribution reservoir given the same pad diameter and plating thickness. This is particularly advantageous in flip chip designs where it is often difficult to adequately clean the flux and other residue from between the chip and substrate following the reflow step. The incomplete removal of flux and other residue may cause poor adhesion of the underfill epoxies, electrical leakage, or corrosion of metals. If the gap is not sufficiently large between the chip and substrate, then the boundary layer of the cleaning solution would prevent or restrict the flow of the cleaning solution between the chip and substrate.

However, the taller solder bump resulting from the use of the solder redistribution reservoirs will improve the effectiveness of the cleaning solution by increasing the gap between the chip substrate.

The underfill process will likewise benefit from the increased gap size. The underfill epoxy is typically of low viscosity and may not flow between the chip and substrate if the gap is too small. The taller solder bumps provide improved clearance, thereby resulting in better underfill. The structure shown in FIG. 11, when scaled to a pitch of 0.250 mm and plated to a height of 0.050 mm, could be expected to increase the gap from 0.07 mm to 0.100 mm.

Furthermore, the taller the solder bump, the more mechanically reliable the solder bump. This is primarily due to the reduction and strain per unit length discussed above. Of special benefit is the reduction of the strain per unit length to below the elastic limit for the solder. This will eliminate the plastic damage which is the cause of solder fatigue failure.

Figure 18:
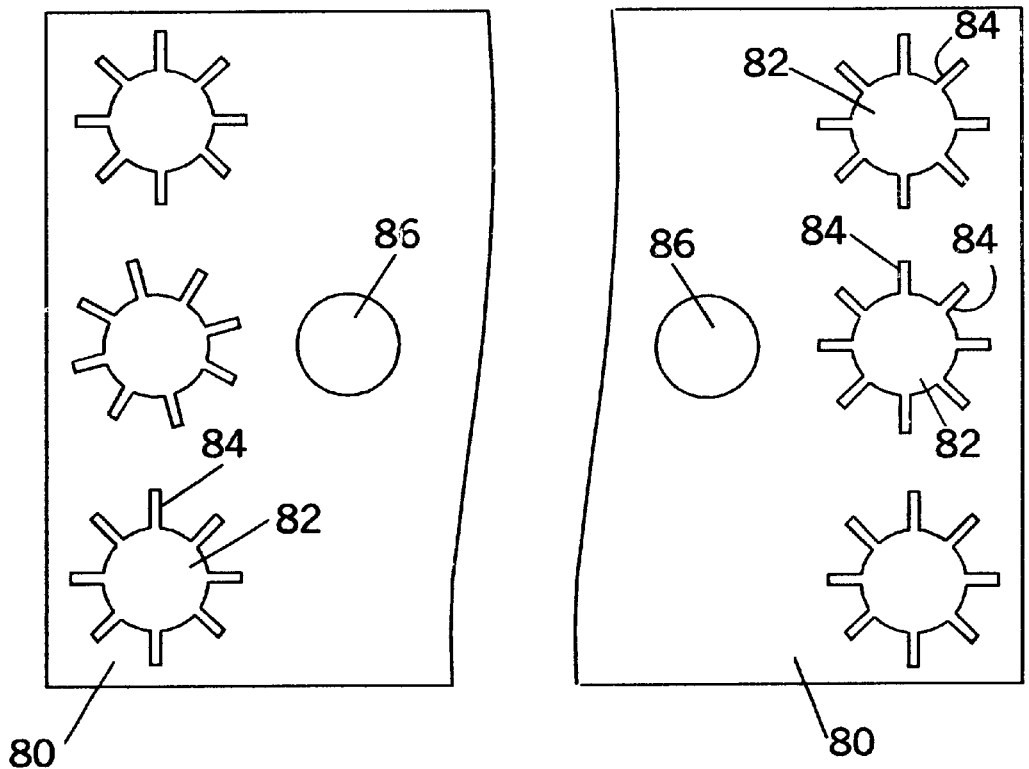
FIG. 18 is a cross sectional view of a flip-chip structure incorporating the solder reservoirs of the present invention.
Figure 19:
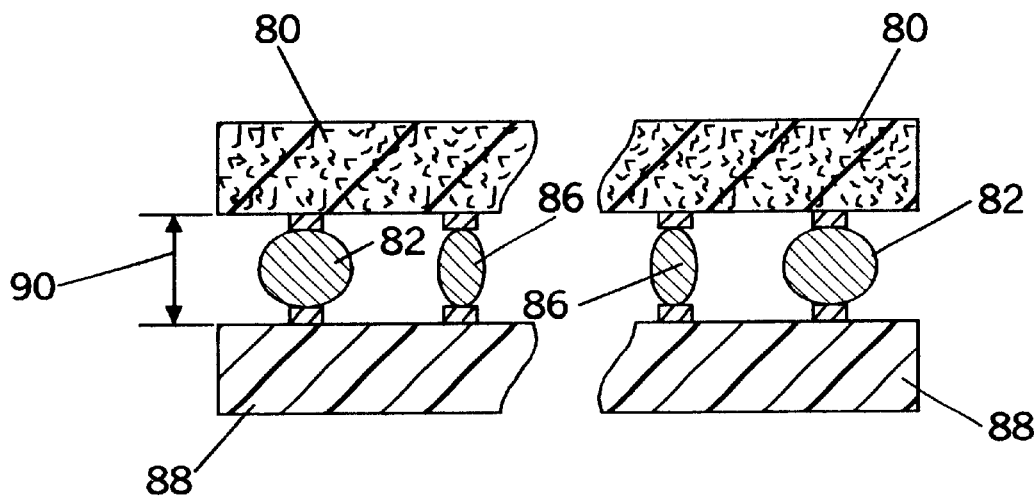
FIG. 19 is a top plan of a substrate including mechanical contact bumps that include solder reservoirs in accordance with the present invention and electrical contact bumps.

An advantageous application of the present invention is illustrated in FIGS. 18 and 19, whereby the reliability of electrical connections in a flip chip device are improved. In particular, with reference to FIG. 18, a chip 80 may comprise mechanical bumps 82 which have one or more solder reflow reservoirs 84 in accordance with the present invention associated therewith, and one or more contact solder bump 86 for forming electrical contacts between the chip 80 and a substrate 88 (FIG. 19). Given substantially uniform plating thickness across chip 80, the mechanical bumps 82 will have a greater volume that the contact bumps 86, and therefore, will be taller. It has been determined that the contact bumps 86 should have a contact pad 90 as equal to or larger than the contact pads 92 associated with the mechanical bumps 82. By using contact pads of the same size or larger with the contact bumps 86, the mechanical bumps 82 will not grow larger that the contact bumps 86 until the contact bumps 86 have soldered to the substrate 88. Alternatively, the flow rate of the soldered to the mechanical bumps 86 from the solder redistribution reservoir may be slowed using a solder redistribution reservoir of a suitable dimension and shape, as described above. As shown in FIG. 19, the taller mechanical bumps 82 create a larger gap or opening between the chip 80 and substrate 88, which stretches the contact bumps 86. As discussed above, the elongated contact bumps 86 are more reliable because the strain per unit length is reduced. It is noted that the bump designs and configurations of FIGS. 18 and 19 are merely exemplary of a bump and associated solder redistribution reservoir which can be utilized to stretch or elongate a contact bump to improve the reliability of the contact bump.

Figure 20A:
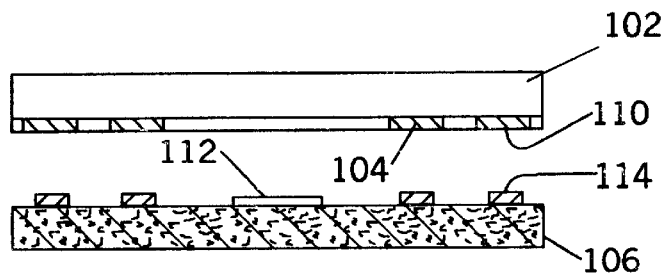
FIGS. 20A–20C are cross sectional views of a microelectronic substrate at various stages during the manufacture of a control pressure chamber in accordance with the present invention.
Figure 20B:
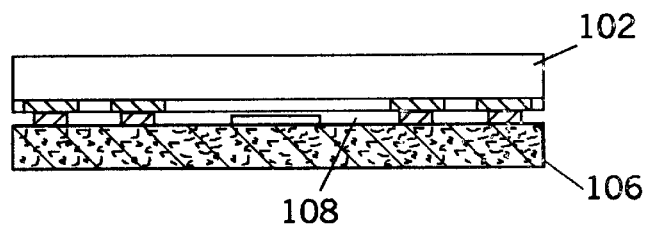
Figure 20C:
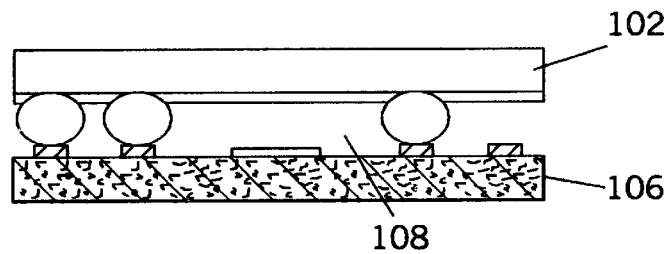
Figure 21:
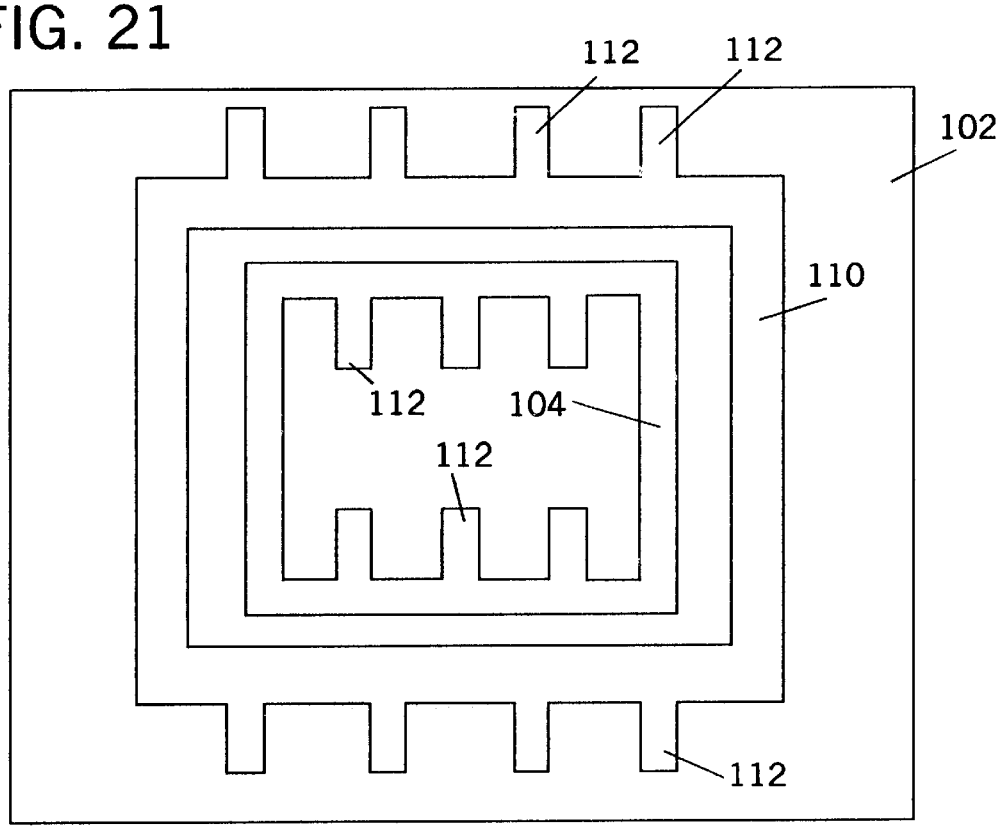
FIG. 21 is a bottom plan of the top substrate in FIGS. 20A–20C.

In yet another advantageous application of the present invention, an improved vacuum may be formed in a sealed chamber, as illustrated in FIGS. 20A–20C, and 21. In particular, a lid or cap 102 is patterned with a soldered seal ring 104 for bonding with a substrate 106 for creating a sealed chamber 108. In the embodiment illustrated, a second seal ring 110 is provided for redundancy and improved reliability, though it is not necessary for the present invention, as best illustrated in FIG. 21. Nonetheless, the second seal ring 110 reduces the pressure differential across the first seal ring 104. Associated with each seal ring 104, 110 is at least one solder redistribution reservoir 112 in accordance with the present invention. While the solder redistribution reservoirs 112 are rectangular in the illustrative embodiment, it is recognized that the solder redistribution reservoirs can be shaped and sized as described herein to achieve a desired result.

A microelectromechanical system (MEMS) device 112, or other device favoring a vacuum environment, is disposed inside the chamber 108. While the MEMS device 112 is shown fabricated on the substrate 106, it will be recognized by those of ordinary skill in the art that the MEMS device can be fabricated on either or both the lid 102 and the substrate 106.

On the substrate, bonding regions 114 are provided in the form of a metalization or other conventional solder wettable material for bonding to the respective solders seal rings 104, 110. The fabrication of the bonding regions is well known and need not be described further herein. Alternatively, solder dams may be utilized, as with cap 102. It is noted that the solder seal rings 104, 110 may be square as shown, or alternatively, circular, rectangular, polygonal, or any other shape.

With particular reference to FIGS. 20A–20C, the cap 102 is initially plated with solder seal rings 104, 110. The cap 102 is then placed on the substrate 106 so that the solder ring aligns with the solder wettable pads on the substrate 106. This procedure is preferably performed in a vacuum environment so that the resulting chamber 108 is at the pressure of the vacuum environment. Upon reflow, the solder seal rings 104, 110 increase in size with the additional solder from the solder redistribution reservoirs, thereby expanding the volume of the chamber 108. The increase in volume decreases the pressure in the chamber 108. Thus, the pressure in the chamber 108 will be less than that of the vacuum environment in which it was sealed.

As an example, using the increase in gap height given above, the gap volume will increase from 0.070 mm*A, where A is the area enclosed by the seal ring, to 0.1 mm*A, The volume increase is then 10/7 or 1.43 times greater. Since pressure is inversely proportional to volume, the pressure will be 30% lower than without the increased gap.

In the drawings and specification, there have been disclosed typical preferred embodiments of the invention, and although specific terms are employed, they are used in a generic and descriptive sense only, and not for the purposes of limitation; the scope of the invention being set forth in the following claims.

Wherefore, the following is claimed:

1. A solder bump structure on a microelectronic substrate, comprising a solder structure including a solder reservoir portion and a solder bump portion, wherein said solder reservoir portion extends from said solder bump portion in a continuous line width gradient.

2. The solder bump structure of claim 1, wherein said solder reservoir portion at least partially wraps around said solder bump portion.

3. The solder bump structure of claim 1, wherein said solder structure comprises a plurality of said solder reservoir portions.

4. The solder bump structure of claim 1, wherein said solder reservoir portion includes a notch to facilitate removal of said solder reservoir portion from said microelectronic substrate.

5. The solder bump structure of claim 1, wherein said solder reservoir portion is shaped to create a pressure gradient along a length of said solder reservoir portion during a solder reflow process.

6. The solder bump structure of claim 5, wherein said pressure gradient creates a positive flow rate of solder to said solder bump portion during said reflow process.

7. The solder bump structure of claim 5, wherein said pressure gradient creates a negative flow rate of solder to said solder bump portion during said reflow process.

8. A solder bump structure on a microelectronic substrate, comprising a solder structure including a solder reservoir portion and a solder bump portion, wherein said solder reservoir portion at least partially wraps around said solder bump portion.

9. The solder bump structure of claim 8, wherein said solder reservoir portion wraps around said solder bump portion to substantially envelop said solder bump portion.

10. The solder bump structure of claim 8, wherein said solder reservoir portion symmetrically wraps around said solder bump portion.

11. The solder bump structure of claim 8, wherein said solder reservoir portion has a proximate end adjacent said solder bump portion and a distal end and wherein said solder reservoir portion at least partially wraps around said solder bump portion with a progressively narrowing width from the proximate end to the distal end.

12. The solder bump structure of claim 8, wherein said solder reservoir portion at least partially spirals around said solder bump portion.

13. The solder bump structure of claim 8, wherein said solder reservoir portion includes a notch to facilitate removal of said solder reservoir portion from said microelectronic substrate.

14. The solder bump structure of claim 8, wherein said solder reservoir portion is shaped to create a pressure gradient along a length of said solder reservoir portion during a solder reflow process.

15. The solder bump structure of claim 8, wherein said pressure gradient creates a positive flow rate of solder to said solder bump portion during said reflow process.

16. The solder bump structure of claim 14, wherein said pressure gradient creates a negative flow rate of solder to said solder bump portion during said reflow process.

17. The solder bump structure of claim 8, wherein said solder structure comprises a plurality of said solder reservoir portions.

18. A solder bump structure on a microelectronic substrate, comprising a solder structure including a solder bump portion having a first width and a plurality of solder reservoir portions extending from said solder bump portion at least one of which has a second width which is less than said first width.

19. A solder bump structure on a microelectronic substrate, comprising a solder structure including a solder reservoir portion and a solder bump portion, wherein said solder reservoir portion includes a notch to facilitate removal of said solder reservoir portion from said microelectronic substrate.

20. The solder bump structure of claim 19, wherein said solder structure comprises a plurality of said solder reservoir portions, at least one of which includes said notch to facilitate removal of said solder reservoir portion from said microelectronic substrate.

21. The solder bump structure of claim 19, wherein said solder reservoir portion is shaped to create a pressure gradient along a length of said solder reservoir portion during a solder reflow process.

22. The solder bump structure of claim 21, wherein said pressure gradient creates a positive flow rate of solder to said solder bump portion during said reflow process.

23. The solder bump structure of claim 21, wherein said pressure gradient creates a negative flow rate of solder to said solder bump portion during said reflow process.

24. A solder bump structure on a microelectronic substrate, comprising a solder structure including a solder reservoir portion and a solder bump portion, wherein said solder reservoir portion is non-linear and has a continuous line width.

25. The solder bump structure of claim 24, wherein said solder reservoir portion at least partially wraps around said solder bump portion.

26. The solder bump structure of claim 24, wherein said solder structure comprises a plurality of said solder reservoir portions.

27. The solder bump structure of claim 24, wherein said solder reservoir portion includes a notch to facilitate removal of said solder reservoir portion from said microelectronic substrate.

28. The solder bump structure of claim 24, wherein said solder reservoir portion is shaped to create a pressure gradient along a length of said solder reservoir portion during a solder reflow process.

* * * * *

UNITED STATES PATENT AND TRADEMARK OFFICE
CERTIFICATE OF CORRECTION

PATENT NO.   : 6,392,163 B1                                                Page 1 of 1
DATED        : May 21, 2002
INVENTOR(S)  : Glenn A. Rinne and Paul A. Magill It is certified that error appears in the above-identified patent and that said Letters Patent is hereby corrected as shown below:

<u>Title page,</u>
Item [57], ABSTRACT,
Line 2, please insert -- flow -- after "the" and before "step".

Signed and Sealed this

Fourteenth Day of January, 2003

JAMES E. ROGAN
*Director of the United States Patent and Trademark Office*